(12) United States Patent
Brescia et al.

(10) Patent No.: US 8,171,679 B2
(45) Date of Patent: *May 8, 2012

(54) INTEGRATED ELECTRICAL CONDUIT FOR SOLAR PV SYSTEM

(75) Inventors: Joe Brescia, Alameda, CA (US); Mark Tofflemire, Alameda, CA (US)

(73) Assignee: Architectural Glass and Aluminum Corporation, Inc., Alameda, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/564,768

(22) Filed: Sep. 22, 2009

(65) Prior Publication Data

US 2010/0071750 A1 Mar. 25, 2010

Related U.S. Application Data

(60) Provisional application No. 61/099,437, filed on Sep. 23, 2008, provisional application No. 61/114,410, filed on Nov. 13, 2008.

(51) Int. Cl.
*E04C 2/54* (2006.01)

(52) U.S. Cl. ....... 52/173.3; 52/235; 52/220.2; 52/220.3; 136/244; 136/291

(58) Field of Classification Search .................. 52/173.3, 52/235, 220.1–220.3, 220.7; 136/244, 291
See application file for complete search history.

(56) References Cited

U.S. PATENT DOCUMENTS

| 3,415,024 | A | * | 12/1968 | Kotlarz | 52/235 |
|---|---|---|---|---|---|
| 4,123,883 | A | | 11/1978 | Barber, Jr. et al. | |
| 4,137,098 | A | | 1/1979 | Field | |
| 4,162,928 | A | | 7/1979 | Shepard, Jr. | |
| 4,178,909 | A | | 12/1979 | Goolsby et al. | |
| 4,184,480 | A | | 1/1980 | Kenny | |
| 4,223,667 | A | | 9/1980 | Paymal | |
| 4,323,719 | A | * | 4/1982 | Green | 136/244 |
| 4,418,506 | A | | 12/1983 | Weber et al. | |
| 4,444,992 | A | | 4/1984 | Cox, III | |
| 4,590,327 | A | | 5/1986 | Nath et al. | |
| 4,636,577 | A | | 1/1987 | Peterpaul | |
| 4,642,413 | A | | 2/1987 | Ovshinsky | |
| 4,644,716 | A | | 2/1987 | Neuroth | |
| 4,677,248 | A | | 6/1987 | Lacey | |
| 4,692,557 | A | | 9/1987 | Samuelson et al. | |

(Continued)

FOREIGN PATENT DOCUMENTS

WO 2006123335 A3 11/2006

OTHER PUBLICATIONS

Kawneer France SA, "Curtain Wall AA 110 Large Span," product literature accessed Oct. 16, 2009 at: http://www.kawneer.com/kawneer/france/catalog/pdf/brochures/AA100_GrandePortee_en.pdf, document created Oct. 2005, 1 page.

(Continued)

*Primary Examiner* — Brian Glessner
*Assistant Examiner* — Matthew J Smith
(74) *Attorney, Agent, or Firm* — J. Nicholas Gross

(57) ABSTRACT

An unitized curtain wall unit houses energy conversion devices (such as photovoltaic modules), and includes integrated wiring conduits for routing signal and power cables within a building façade or exterior shell structures.

28 Claims, 8 Drawing Sheets

U.S. PATENT DOCUMENTS

| | | | |
|---|---|---|---|
| 4,782,636 A * | 11/1988 | Stoakes | 52/235 |
| 4,888,702 A * | 12/1989 | Gerken et al. | 320/101 |
| 5,039,352 A | 8/1991 | Mueller et al. | |
| 5,115,612 A | 5/1992 | Newton et al. | |
| 5,125,608 A * | 6/1992 | McMaster et al. | 52/173.3 |
| 5,128,181 A | 7/1992 | Kunert | |
| 5,213,627 A | 5/1993 | Marquardt et al. | |
| 5,232,518 A | 8/1993 | Nath et al. | |
| 5,253,459 A | 10/1993 | Parinas et al. | |
| 5,273,593 A | 12/1993 | Marquardt et al. | |
| 5,373,672 A | 12/1994 | Schulz | |
| 5,384,994 A | 1/1995 | Borba | |
| 5,409,549 A | 4/1995 | Mori | |
| 5,474,620 A | 12/1995 | Nath et al. | |
| 5,505,788 A | 4/1996 | Dinwoodie | |
| 5,524,401 A | 6/1996 | Ishikawa et al. | |
| 5,540,514 A | 7/1996 | Demars et al. | |
| 5,571,338 A | 11/1996 | Kadonome et al. | |
| 5,589,006 A | 12/1996 | Itoyama et al. | |
| 5,647,915 A | 7/1997 | Zukerman | |
| 5,684,325 A | 11/1997 | Kataoka et al. | |
| 5,762,720 A | 6/1998 | Hanoka et al. | |
| 5,787,653 A | 8/1998 | Sakai et al. | |
| 5,961,740 A | 10/1999 | Wambach et al. | |
| 5,968,287 A | 10/1999 | Nath | |
| 6,066,797 A | 5/2000 | Toyomura et al. | |
| 6,075,201 A | 6/2000 | Wambach | |
| 6,093,884 A | 7/2000 | Toyomura et al. | |
| 6,111,189 A * | 8/2000 | Garvison et al. | 136/244 |
| 6,148,570 A | 11/2000 | Dinwoodie et al. | |
| 6,180,868 B1 | 1/2001 | Yoshino et al. | |
| 6,201,180 B1 | 3/2001 | Meyer et al. | |
| 6,235,984 B1 | 5/2001 | Wambach et al. | |
| 6,329,589 B1 | 12/2001 | Tang et al. | |
| 6,360,491 B1 | 3/2002 | Ullman | |
| 6,360,497 B1 | 3/2002 | Nakazima et al. | |
| 6,412,242 B1 | 7/2002 | Elmer et al. | |
| 6,421,966 B1 | 7/2002 | Braunstein et al. | |
| 6,442,911 B2 | 9/2002 | Elmer et al. | |
| 6,465,724 B1 | 10/2002 | Garvison et al. | |
| 6,467,227 B2 | 10/2002 | Elmer et al. | |
| 6,506,970 B2 | 1/2003 | Yamawaki | |
| 6,617,507 B2 | 9/2003 | Mapes et al. | |
| 6,623,203 B2 | 9/2003 | Kreyenborg et al. | |
| 6,646,196 B2 | 11/2003 | Fronek et al. | |
| 6,653,551 B2 | 11/2003 | Chen | |
| 6,670,541 B2 | 12/2003 | Nagao et al. | |
| 6,672,018 B2 | 1/2004 | Shingleton | |
| 6,693,237 B2 | 2/2004 | Zenko et al. | |
| 6,715,955 B2 | 4/2004 | Ginzel | |
| 6,750,391 B2 * | 6/2004 | Bower et al. | 136/244 |
| 6,800,801 B2 | 10/2004 | Sasaoka et al. | |
| 6,883,290 B2 | 4/2005 | Dinwoodie | |
| 6,914,182 B2 | 7/2005 | Takeda et al. | |
| 6,928,775 B2 | 8/2005 | Banister | |
| 6,959,517 B2 | 11/2005 | Podany et al. | |
| 7,012,188 B2 | 3/2006 | Erling | |
| 7,098,395 B2 | 8/2006 | Hiraishi | |
| 7,155,869 B2 | 1/2007 | Wildenhain et al. | |
| 7,155,870 B2 | 1/2007 | Almy | |
| 7,178,295 B2 | 2/2007 | Dinwoodie | |
| 7,190,531 B2 | 3/2007 | Dyson et al. | |
| 7,307,209 B2 | 12/2007 | Mapes et al. | |
| 7,328,534 B2 | 2/2008 | Dinwoodie | |
| 7,342,171 B2 | 3/2008 | Khouri | |
| 7,406,800 B2 | 8/2008 | Cinnamon et al. | |
| 7,432,618 B2 | 10/2008 | Taylor | |
| 7,435,134 B2 | 10/2008 | Lenox | |
| 7,435,897 B2 | 10/2008 | Russell | |
| 7,571,575 B2 | 8/2009 | Ernewein et al. | |
| 7,574,842 B2 | 8/2009 | Russell | |
| 7,592,537 B1 | 9/2009 | West | |
| 7,600,349 B2 | 10/2009 | Liebendorfer | |
| 7,605,498 B2 | 10/2009 | Ledenev et al. | |
| 7,665,254 B2 * | 2/2010 | Brandner | 52/173.3 |
| D611,800 S | 3/2010 | Ghatikar | |
| 7,694,466 B2 | 4/2010 | Miyamoto et al. | |
| 7,845,128 B2 * | 12/2010 | Brescia | 52/235 |
| 7,941,982 B2 | 5/2011 | Merica | |
| 2002/0020119 A1 | 2/2002 | Oberhofer et al. | |
| 2003/0070368 A1 | 4/2003 | Shingleton | |
| 2003/0154671 A1 | 8/2003 | Elmer | |
| 2003/0221381 A1 | 12/2003 | Ting | |
| 2004/0202803 A1 | 10/2004 | Hoover | |
| 2005/0237445 A1 | 10/2005 | Grupp et al. | |
| 2005/0284516 A1 | 12/2005 | Koll | |
| 2006/0042682 A1 | 3/2006 | Wolfe et al. | |
| 2006/0107993 A1 | 5/2006 | Krokoszinski et al. | |
| 2006/0213139 A1 | 9/2006 | Stramandinoli | |
| 2007/0079861 A1 | 4/2007 | Morali | |
| 2007/0267150 A1 | 11/2007 | Schaumberger et al. | |
| 2008/0066402 A1 | 3/2008 | Walker et al. | |
| 2008/0087320 A1 | 4/2008 | Mapes et al. | |
| 2008/0092952 A1 | 4/2008 | Chen et al. | |
| 2008/0092953 A1 | 4/2008 | Lee | |
| 2008/0097655 A1 | 4/2008 | Hadar et al. | |
| 2008/0099228 A1 | 5/2008 | Wilker et al. | |
| 2008/0163918 A1 | 7/2008 | Li | |
| 2008/0236654 A1 | 10/2008 | Pietrangelo | |
| 2009/0019795 A1 | 1/2009 | Szacsvay et al. | |
| 2009/0120485 A1 | 5/2009 | Kikinis | |
| 2009/0277494 A1 | 11/2009 | Mazzer et al. | |
| 2009/0320388 A1 | 12/2009 | Lilli et al. | |

OTHER PUBLICATIONS

Kawneer France SA, "Curtain Wall AA 110 Photovoltaic," product literature accessed Oct.16, 2009 at: http://www.kawneer.com/kawneer/france/en/product.asp?cat_id=589&prod_id=3031, 3 pages.

Kawneer France SA, "Curtain Wall AA 110 Photovoltaic Curtain wall and glass for production of electricity by solar energy," product literature accessed Oct. 16, 2009 at: http://www.kawneer.com/kawneer/france/catalog/pdf/brochures/AA110_photovoltaique_en.pdf, document created Oct. 2005 1 page.

Kawneer France SA, "Curtain Wall AA 201 Module Modular Curtain Wall for Quick Installation," product literature accessed Oct. 16, 2009 at: http://www.kawneer.com/kawneer/france/catalog/pdf/brochures/AA210_modulaire_gen_en.pdf, document created Oct. 2005,1 page.

Kawneer France SA, "Un Nouveau Regard Sur L' Aluminium," product brochure accessed Oct. 16, 2009 at: http://www.kawneer.com/kawneer/france/catalog/pdf/brochures/plaquette_Institutionnelle.pdf, Jan. 2007, 16 pages.

Wausau Window and Wall Systems, "Wausau Provides Solar-Powered Curtainwall for Wal-Mart's Experimental Store Opening Jul. 20 in McKinney, Texas," press release, Jul. 2005, 2 pages.

Roedern, B. Von, "Status of Amorphous andCrystalline Thin Film Silicon Solar Cell Activities," Presented at the National Center for Photovoltaics and Solar Program Review Meeting Denver, Colorado Mar. 24-26, 2003, 7 pages.

Clarke, J.A. et al., "The Deployment of Photovoltaic Components Within the Lighthouse Building in Glasgow," Proc. 16th European Photovoltaic Solar Energy Conf., Glasgow, May 2000, 4 pages.

Clarke, J.A. et al., "Integrated Building Simulation: State-of-the-Art," In Proceedings Indoor Climate of Buildings.—S. I.: s.n.,1998, 8 pages.

Gottschalg, R. et al., "Performance of Amorphous Silicon Double Junction Photovoltaic Systems in Different Climatic Zones," 29th IEEE Photovoltaic Specialists Conference, New Orleans, 2002, 4 pages.

Hensen, J. et al., "Building simulation: state-of-the-art and the role of IBPSA," In Proc. Symposium Modellen voor gebouw- en installatiesimulatie, Delft, 19 oktober 1999.—Delft : Energieonderzoek Centrum Nederland, 1999.—p. 1-9.

Musser, George, "Invert your thinking: Squeezing more power out of your solar panels," Scientific American, Aug. 26, 2009, 3 pages.

Kolodziej, A., "Staebler-Wronski effect in amorphous silicon and its alloys," OPTO-Electronics Review 12(1), 21-32 (2004), 12 pages.

Cullen, Richard, "What is Maximum Power Point Tracking (MPPT) and How Does it Work,?" www.blueskyeenergy.com, 2004, 2 pages.

Walker, Geoffrey, "Cascaded DC-DC Converter Connection of Photovoltaic Modules," IEEE Transactions on Power Electronics, vol. 19, No. 4, Jul. 2004, 10 pages.

Walker, Geoffrey, "Evaluating MPPT Converter Topologies Using a Matlab PV Model," pdf document created May 1, 2002, 6 pages.

Walker, G.R., "PV String PER-Module Maximum Power Point Enabling Converters," Proceedings of the Australasian Universities Power Engineering Conference, 2003, 6 pages.

Yang, Jeffrey et al., "Amorphous silicon based photovoltaics—from earth to the "final frontier, Solar Energy Materials & Solar Cells 78 2003, 24 pages.

Notification of Transmittal of the International Search Report and the Written Opinion of the International Searching Authority, or the Declaration for PCT/US2009/058059 mailed Feb. 2, 2010, 29 pages.

Visionwall Project Profile, www.visionwall.com, Printed in Canada Nov. 16, 2005, 2 pages.

\* cited by examiner

INTEGRATED ELECTRICAL CONDUIT FOR SOLAR PV SYSTEM

RELATED APPLICATION DATA

The present application claims the benefit under 35 U.S.C. §119(e) of the priority date of Provisional Application Ser. No. 61/099,437 filed Sep. 23, 2008 and Provisional Application Ser. No 61/114,410 filed Nov. 13, 2008, both which are hereby incorporated by reference. The application is further related to the following applications, all of which are filed on this same date and incorporated by reference herein:

Building Integrated Power Generating System; Ser. No. 12/564,609;

UL Compliant Building Integrated Photovoltaic Conversion System; Ser. No. 12/564,627, now U.S. Pat. No. 7,845,126;

Method of Operating Building Integrated Photovoltaic Conversion System Ser. No. 12/564,664;

Building Integrated Photovoltaic Conversion System Implemented With Integrated Control Management Units Ser. No. 12/564,671, now U.S. Pat. No. 7,847,181;

Building Integrated Photovoltaic Conversion System Implemented In Both Vision and Spandrel Areas Ser. No. 12/564,686, now U.S. Pat. No. 7,845,127;

Unitized Curtain Wall Module Adapted for Integrated Photovoltaic Conversion Module Ser. No. 12/564,732;

Unitized Building Integrated Photovoltaic Conversion Module Ser. No. 12/564,740, now U.S. Pat. No. 7,845,128;

Unitized Building Integrated Photovoltaic Conversion Module Adapted With Electrical Isolation and Grounding Ser. No. 12/564,748;

Unitized Building Integrated Photovoltaic Conversion Module Adapted With Electrical Conduits Ser. No. 12/564,761;

Electrical Raceway for Building Integrated Solar PV System; Ser. No. 12/564,774;

Method of Assembling Building Integrated Photovoltaic Conversion System; Ser. No. 12/564,783;

FIELD OF THE INVENTION

The present invention relates to unitized curtain wall units, particularly units which house energy conversion devices (such as photovoltaic modules), and include integrated wiring conduits for routing signal and power cables within a building façade or exterior shell structures.

BACKGROUND

It has been long been considered desirable to integrate photovoltaic (or PV) devices and systems into commercial and residential buildings. To date, however, such systems have been generally limited to conventional roof-top based systems which have limited photovoltaic capability and little aesthetic appeal. Conventional roof-top based systems are limited in photovoltaic capability because, among other reasons, the modules which make up these conventional systems are connected in series which effectively lowers the productivity of the entire system to that of the least productive of the modules. Conventional roof-top based systems also depend upon racking systems which do not afford a practical method to integrate photovoltaic elements into a vertical building face in an attractive and safe manner. Shading by building elements, equipment, and other constraints severely limit the area available for PV deployment.

Clearly it would be desirable to incorporate PV devices in a larger area of a building structure, and in a more visually appealing fashion. In a recent attempt at such an endeavor, a building in New York City incorporated PV elements in vertical façade assemblies that were actually physically separate from the main structure, and configured as artistic elements. The project was in fact a failure due to the inability of the system designer to overcome regulatory restrictions on the incorporation of electrical elements into this type of structure. Thus, while the panels are still attached to the side of the building, they have not been utilized to generate useful PV power.

"Unitized" curtain wall systems are those which can be preassembled and glazed as units (i.e., the glass or other surface material installed) off site and progressively installed section by section on a building. One advantage of the unitized curtain wall approach is that the labor is performed in an off site, controlled, manufacturing environment. Unitized systems are suitable for mid to large projects, i.e. high-rise buildings (four stories or more), those with significant repetition of their components, and/or projects in locations that have higher seismic design requirements. Frame units for unitized curtain walls are typically configured as one module (glazing or glass unit) wide by one story in height. These pre-glazed frames are typically placed on bunks consisting of about 6 units each and hoisted by a tower crane to their respective floors where they are installed, often by utilizing a small mobile hoist from the floor above.

The unitized curtain wall systems also typically include a pressure equalized rain screen, which counteracts the forces that cause water infiltration, such as surface tension, capillary action, gravity, kinetic energy, and pressure differential. Unitized curtain wall systems are in wide spread use and gaining commercial popularity across for the country because of their ease of integration, reasonable cost, schedule-friendly capabilities and aesthetic beauty and high performance.

Photovoltaic modular panels have been integrated into curtain wall glass for building integrated photovoltaics, as seen in U.S. Publication Serial No. 2008/0163918 incorporated by reference herein. Nonetheless the design described is optimized only for amorphous type solar cells, and is not conducive to ease of construction because it is not configured for efficient inter-modular connection. Nor does such design compensate for shading, a problem that severely impairs the performance of conventional series-connected solar panels particularly in articulated applications like building enclosures. As is well known, in conventional PV approaches shading degrades the performance and power output (or yield) of the shaded module or unit. When shading falls on one or more of the conventional series-connected solar panels, the series connected modules degrade in overall performance to that of the lowest yield in the string. Finally the prior art also fails to address the lack of overall Underwriters Laboratory certification or UL approval. UL certification of the framing system is an essential element to enable PV projects to be approved under applicable building and safety regulations, and thus is a key element to enable widespread adoption. Many commercially available modules are UL Approved to UL 1703, but no framing systems related to Building Integrated Photovoltaics (UL Category QHZQ) are commercially available today WO 2006/123335 incorporated by reference herein suffers from similar deficiencies, in that inter-module connections (in particular those between each individual solar module and those adjacent left and right) are depicted in great detail. However, this system is connected in series, without individual module management. In addition, the array construction method lacks inter-module conduits or passages suitable for routing wiring. Moreover, the modules are connected to each other only in a lateral (left and right) fashion; there is no teaching of vertical connection. For this reason any vertical connections must be accommodated through additional structures, such as tracks, tubes or strips that are not integrated into the curtain wall framing members. U.S. Pat. No. 6,646,196 incorporated by reference herein shows a similar set up, and suffers similar deficiencies. These additional runs add cost and complexity to installation, reduce operational efficiency, raise maintenance costs and complexity, and potentially increase susceptibility to failure.

SUMMARY OF THE INVENTION

An object of the present invention, therefore, is to reduce and/or overcome the aforementioned limitations of the prior art.

A first aspect of the invention concerns a building integrated power generating system;

Another aspect of the invention concerns a building integrated power generating system that is UL/regulatory compliant;

A further aspect concerns integrating control management units into such power generating system;

Yet another aspect concerns a building integrated power generating system that is implemented in both vision and spandrel areas of a building façade;

Other aspects include unitized curtain wall units that are adapted for photovoltaic energy conversion modules;

Still other aspects cover electrical isolation, electrical conduits and grounding features of such unitized curtain wall units and associated building integrated power generating systems;

Another aspect of the invention covers integrated wireways/raceways used with the unitized curtain wall units;

Further aspects concern methods of assembling/manufacturing such unitized curtain wall units and building integrated photovoltaic conversion systems;

Other aspects include methods of operating the conversion modules, the control modules, and an entire power generating array integrated within a building shell;

Finally, other aspects of the inventions will be apparent to those skilled in the art from the detailed disclosure that follows.

It will be understood from the Detailed Description that the inventions can be implemented in a multitude of different embodiments. Furthermore, it will be readily appreciated by skilled artisans that such different embodiments will likely include only one or more of the aforementioned aspects or objects of the present inventions. Thus, the absence of one or more of such characteristics in any particular embodiment should not be construed as limiting the scope of the present inventions. While described in the context of a power generating array within a building façade, it will be apparent to those skilled in the art that the present teachings could be used in any number of applications.

DETAILED DESCRIPTION

Figure 1:
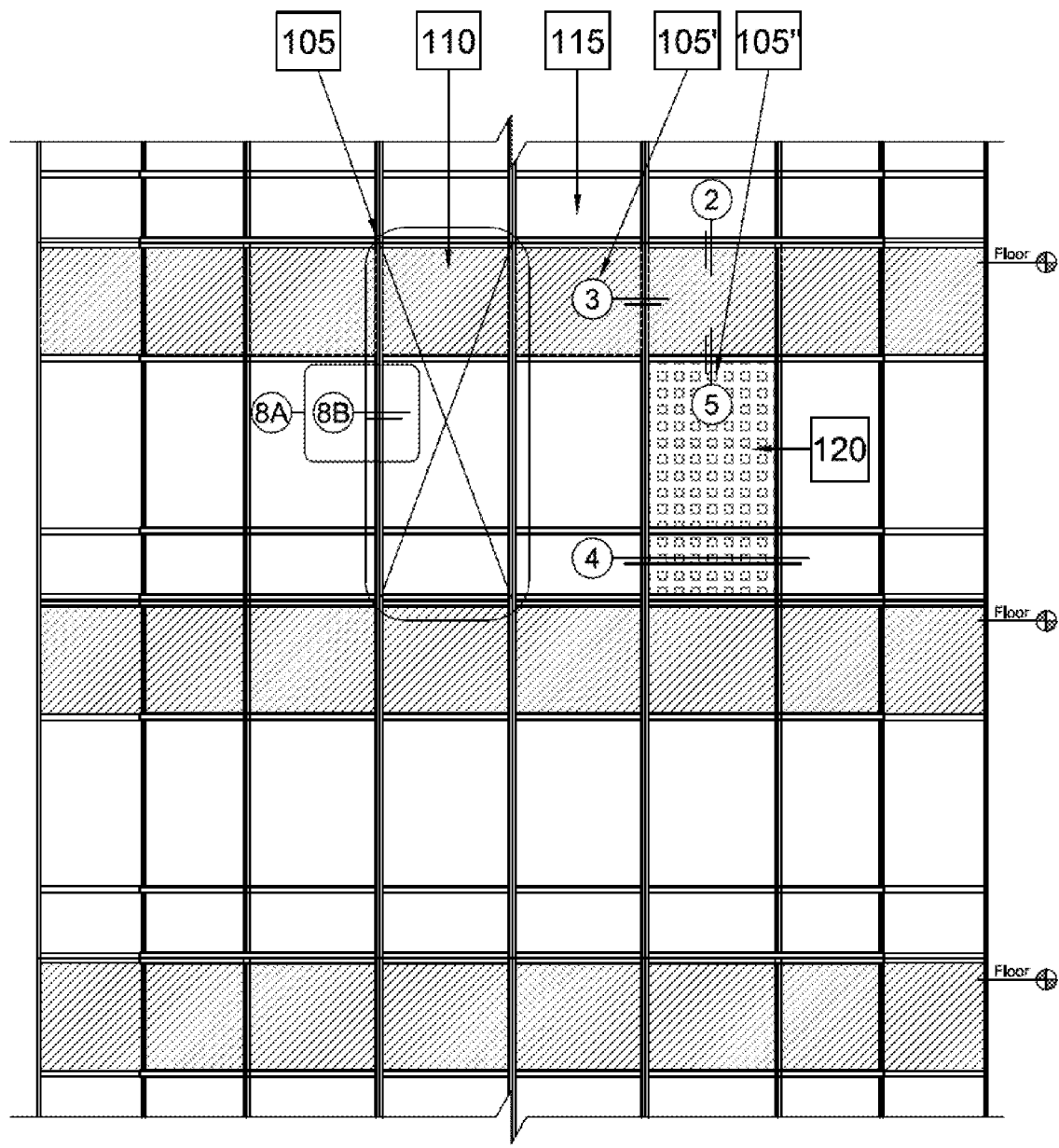
FIG. 1 is an illustration of a preferred embodiment of a photovoltaic power generating system implemented within an exterior shell or façade of a building structure.

The present invention preferably incorporates mono and/or poly silicon crystalline cells used for converting solar energy into electrical energy, such as those offered by Suntech Power Holdings Co. Ltd. (Suntech) directly into standardized curtain wall products, such as those offered by Architectural Glass and Aluminum Co, Inc (AGA) of Alameda Calif. The AGA curtain wall products are well-known durable exterior façades. The end result is a solar power generation system that also, much in the same manner as conventional curtain wall, functionally and aesthetically encloses a building.

By incorporating solar energy directly in the construction process for a building, the cost of implementing such green capability is greatly reduced. The cost of operating such buildings also goes down dramatically as a result of net energy savings by reducing the need for lighting using Daylighting Techniques and by controlling the solar heat gain and envelope U-value to reduce the energy needed for heating, ventilation and air-conditioning systems (HVAC).

The invention also has applicability, however, to retrofitting/re-cladding existing buildings to include solar capability, particularly when such structures include mechanical screening surrounding their rooftop. The invention can be used in such instances to both beautify and increase the functionality of such otherwise unaesthetic and nonfunctional architectural features.

Unitized Curtain Walls

Before delving into the specifics of the present invention, it is useful to describe and understand the characteristics of unitized curtain walls. Unitized curtain walls are an extremely popular form of building façade used throughout the world.

The main defining characteristic of unitized curtain walls are that they are substantially (and usually entirely) preassembled off site in units and, after transport to the project site, hung or fastened onto on the building's structural slab edges. The unitized curtain wall does not typically function as a structural support element for the building. The final installation of these pre-assembled units into the integrated whole results in a "unitized" curtain wall system.

Off-site pre-assembly of the units is far preferable to onsite because operations can be done far more efficiently—at a dedicated facility by skilled personnel—with much lower cost and with higher speed and throughput. Off-site assembly also leads to higher quality work with better seals, stronger bonds, and fewer errors, and further enables assembly bench testing prior to transportation and installation.

In contrast conventional stick built curtain wall systems require that the aluminum or metal frames for the glazing be field-assembled at the jobsite according to the specific architectural requirement. The labor for such solutions is costly, and the quality of such an installation is difficult to control from one unit to the next. Moreover, because stick built curtain wall frames are not manufactured in a controlled factory environment, before they can be UL certified, they must be field inspected, one by one, for approval. Such one by one field inspection is less preferable than the present invention, because the one by one approach consumes longer time and runs the risk that inspection, even after the expense of transport and assembly on site, will fail to result in certification. Prior building integrated PV curtain walls, such as that mentioned in New York City above, suffered these very failures.

Unlike stick built approaches, curtain wall unitized panels are typically prefabricated as standardized 4'-8' width×10'-15' height units made up of different cladding materials (stone, painted aluminum, glass, opaque-glass, etc.) depending on the desired aesthetic/look the Architect is trying to achieve. A common form factor is five feet wide by thirteen and a half feet tall. The shop pre-assembly of the different materials into a unit, among other things, allows for:

- better quality control of the finished product (both the units themselves and the overall curtain wall system) and,
- easy (and thus rapid) installation on site, as each unitized panel 'mates' with the one above, with the one below and with the ones to either side of it, thereby adding support, and achieving continuity and integrity for the overall wall once completed.
- Decreased duration on job site, thus leading to improved and more efficient construction schedules
- minimized packaging because the unitized pre-assembled units may be transported to the site with less packaging and waste than stick built, thus promoting environmental goals for reducing and recycling of jobsite packaging.

A unitized curtain wall unit is typically made up of the following major parts/components:

Framing Members: these capture and support the different cladding or glazing materials desired and frame them into a unit which is manageable and conveniently sized for final installation. The framing is typically rectangular (although other shapes could be used) with vertical framing elements and horizontal framing elements. Framing members may be comprised of any materials known in the art, including, aluminum, steel, fiberglass or other composite materials. The vertical framing elements (sometimes called 'mullions'), of each unit 'mates' with the units adjacent, thereby providing support to the adjacent units and achieving continuity of the wall system once completely installed. The primary horizontal framing elements (sometimes called the 'stack joints') at the top and bottom of the unit also mate with the units above and below, similarly providing support to the adjacent unit and the entire wall and achieving continuity of the wall system once completely installed. Preferably, each unitized curtain wall unit also includes one or more intermediate horizontal members. These intermediate horizontal members are typically used to hold or mount and provide support to pieces of glazing or cladding. For example, the glazing below might be transparent or vision glass, while that above might be PV material. In unitized curtain wall, these framing members are pre-assembled in the factory. The pre-assembled frame thus forms the skeleton of the unit which will, after completion of the pre-assembly as described below, be transported to the building site for installation.

Support Structure/Brackets: are used to fix/connect each of the curtain wall units to the edge of the building's floor-slab. In addition to providing the structural support for the wall, these brackets provide the ability to take up variation in the building's construction (typically +/−2 to 4 inches) and exactly align each of the units with one another (typically within +/−⅛ to ¼ of an inch) to achieve the continuity required and the aesthetic alignment desired. Typically, the support structures/brackets are composed of two mating components. One of these is pre-assembled into the unitized frame at the factory. The other mating component of the support structure/brackets is typically fastened to the building's floor-slab onsite. In this manner, the installation on site can be achieved with convenient attachment of the mating components.

Sealant/Gaskets: physically connect and isolate the cladding or glazing materials to the framing members. The sealant/gaskets effectively affix the cladding materials to the framing members, providing a waterproof seal. The sealant/gasket material is typically semi-flexible to accommodate minor movement of the frame relative to the cladding material. This isolation of movement is particularly important for PV, glass, or stone as they can break due to their brittle nature, but also important with other thin, opaque materials due to their tendency to buckle producing an undesirable aesthetic. In the building integrated PV application, it is preferable to incorporate UL approved materials designed specifically for this purpose to assure System UL Compliance. In the building integrated PV application, the sealants and gaskets also serve to electrically insulate PV from framing in many applications. The sealant and gaskets are pre-assembled to the frames and glazing as part of the pre-assembly.

Glazing or Cladding: the material which forms the aesthetic and structural exterior of the final unitized curtain wall. Different cladding materials (stone, painted aluminum, glass, opaque-glass, etc.) may be utilized depending on the desired aesthetic/look. The glazing or cladding is attached to the unitized curtain wall frame members during pre-assembly.

Vision Material: the transparent glazed area of the unit located in the zone(s) through which occupants view out or through which daylight is to be admitted to the building interior. This zone is typically the entire width of the curtain wall unit/panel×18"-40" above the floor to the underside of the ceiling. The vision material is also pre-assembled into the unit in the factory.

Spandrel Area: In a building with more than one floor the term spandrel is also used to indicate the space between the top of the window in one story and the sill of the window in the story above. The term is typically employed when there is a sculpted panel or other decorative element in this space, or when the space between the windows is filled with opaque or translucent glass, in this case called spandrel glass. Further, many opaque or translucent materials can be used, including any of a number of form factors of energy conversion devices.

The glazing or cladding for the spandrel area is attached to the unitized curtain wall frame members during pre-assembly.

It will be understood by those skilled in the art that this is a simplified description, and not intended to be an exhaustive list. The components may vary from those described. Moreover not every curtain wall unit will require such components, and some units may in fact use other components without deviating from the spirit of the present teachings and techniques.

The labor and assembly process associated with curtain wall units is also divided into separate phases which allows for more optimized costing associated with the various activities and better predictability of scheduling.

Fabrication Labor: typically includes all the labor involved in making or cutting/shaping each of the constituent framing and support parts of the curtain wall unit and then pre-assembling all the parts into the pre-assembled units designed for installation at the particular project. Since the curtain wall units are assembled typically in a dedicated facility, consistency and quality can be better controlled and optimized.

Installation Labor: typically includes the labor involved in attaching the support brackets/structures to the building, laying out, hoisting, and hanging the curtain wall units on the building, mating and aligning all the units and taking up tolerances, completing the necessary electrical connections, adding final seals, insulation and any interior finish trim that needs to be coordinated with finish material (like ceilings or sheetrock) that are typically provided by others. Because the on-site assembly method of the unitized curtain wall units is effectively identical and because all of the units have a common method for mating and attachment, the skill sets of the assemblers can be standardized and more easily controlled as well.

Unitized PV Curtain Walls

The present invention aims to enable unitized curtain wall systems to deliver energy production capability—more specifically photovoltaic functionality similar to a rooftop PV installation. That is, a system that primarily functions to generate electricity from solar power once the entire set of parts are assembled, and also performs the same aesthetic cladding function as prior art curtain wall systems. The difference here, of course, is that the power generation must be as compatible as possible with the requirements of a PV curtain wall unit, including resistance and compliance with various regulations concerning heat/conductive/insulation properties, air/water infiltration, wind load resistance and seismic considerations.

To accomplish this, a photovoltaic (PV) curtain wall unit includes the following (in addition to some or all of the standard components noted earlier):

Photovoltaic Panels: for a wall-system application, these are preferably glazable PV panels—and so can be thought of as a direct material replacement for the opaque glazed spandrel and/or vision material in the curtain wall unit—although there are some differences between these materials that are accommodated/designed for as shown in the present embodiments. Other types of panels/energy conversion devices can of course be used, and in this respect the invention is effectively panel-device agnostic. Varying cell density, photovoltaic materials, opacity, and aesthetic look can be adjusted as needed to meet the desired appearance, aesthetics and requirements.

Inverters/module management units/controls: these typically convert and optimize electricity generated by PV panels into grid compliant power. Preferably, the inverters/module management units/controls are provided locally and individually, at each curtain wall unit, to allow the PV wall system to more efficiently generate electricity from solar power. As mentioned, there is frequently greater variability in light exposure from one portion of a vertical building surface to another than there is on a typical rooftop installation. As a result, for BIPV applications, it is preferable that local controls account for self or site shading of each individual wall unit/panel and eliminate or reduce the otherwise typical impact from shading in which one shaded unit/module degrades the performance of the entire string of modules in the affected series. Shading can result from shadows cast by trees, other buildings, dust accumulation, and even birds, planes, and window cleaners. These conditions occur frequently on vertical curtain wall environments, and it is therefore important that the integrated PV curtain wall system include necessary controls and methods to mitigate and/or avoid this deleterious impact. In addition, these inverter/control elements should be easily accessible for maintenance and yet preferably be hidden from view of the occupants of the space as well as from viewers of the building exterior for both safety and aesthetic purposes. Finally, it preferable that of the above components should be rated UL or equivalent, and outdoor rated to accommodate for building construction conditions.

Wiring: wiring is preferably accommodated to carry power (and preferably control signals, where necessary) all the way from the PV panels to the grid without adding additional architectural complexity. Ideally, the wiring will be effectively invisible in the installation condition. In the preferred embodiment means are provided from each PV panel, through the curtain wall unit, to transport the generated electricity in a safe and controlled way through the entire wall array and ultimately to the interior of the building. Similar to the needs of the local inverter/controls, the wiring in a curtain wall system should preferably be done efficiently (i.e., preferably few wires for a long array run helps limit the size of the code required raceway (or other required wiring passage)), in an aesthetically pleasing manner (which, in a curtain wall system typically means hidden from view) while being protected from damage and accessible for maintenance. It will be appreciated that in other power generating applications involving other energy conversion devices, other types of tubing/conduits, etc., can be employed to transport other energy related materials, including heated/cooled fluids, etc. between modules and other parts of a circulation system within a building structure.

Accordingly, unlike previous applications of PV technology on a vertical wall, each PV curtain wall unit of the present invention can be sold, delivered and installed as a complete unit. Each PV curtain wall unit is preferably preassembled off site and transported to the building as a prefabricated module, allowing this new application to not only be simply, quickly hung on the building, but also, as panels, wiring, inverters and controls have also been prefabricated into a series of connected code-rated raceways attached to or formed by the unit framing, each unit can be simply, quickly and efficiently connected, coupled or plugged as needed into its neighboring units.

In an electrical generation system each unit is preferably linked to a common grounding mechanism using methods well known in the art.

As described above, one main purpose of the invention is to provide a photovoltaic power from a unitized curtain wall system. The units assembled according to the teaching of the invention will preferably be connected or linked in a manner that accumulates the electricity generated by each unit in the manner described above. The electricity so accumulated is connected to the building's primary electrical system and grid tied as appropriate, using methods known in the art. It is possible that the electricity in the system may be harnessed to run existing mechanical systems within the building envelope such as shading devices, window treatments, or blinds. This implementation thus allows a solar energy system to be installed as part of a building façade with the same ease and minimal additional labor cost.

Specific Details of Preferred Embodiment

In a conventional rooftop system, PV panels, wiring, controls, rack/support, etc. are all assembled on site and then plugged into the inverter/storage mechanisms. In the case of a preferred unitized PV curtain wall as described herein the PV curtain wall units are preferably each 'plug and play'— each unit mates into and is electrically coupled to its adjacent unit to form the solar array. In turn, the solar array is electrically connected into the balance of the building electrical system. In this respect therefore, the inventions better achieve the functionality of a conventional rooftop system, but do so on the vertical sides of the building. Because a typical high rise building has 7-12 times greater wall than rooftop space, the present invention allows far greater harvest of solar energy.

In a preferred embodiment the invention is used preferably in cladding at least a substantial vertical portion of a building structure 100 as seen in a partial elevation drawing in FIG. 1. The degree to which PV and non-PV curtain wall units are included and interconnected within a cladding can be tailored as needed for any particular site requirements and system goals. Please note that the elements shown in the figure are not intended to denote specific sizes or ratios, as it expected that the invention will take many different forms, sizes, and form factors in different types of installations. Moreover although the discussion herein is presented primarily in the context of a commercial structure, it is expected that embodiments can be used on virtually any other type or variety of structures, including residential structures, parking structures, other non-habitable structures, hospitals, airport terminals, train station terminals, sea port terminals, government buildings and even within transportation systems such as elevated rails, bridges, and other structures offering suitable solar exposure. Furthermore while shown as part of an exterior of the building, the cladding could be extended to other interior areas of a structure as well, such as may be found in an atrium, a courtyard, etc.

A preferred unitized curtain wall structure covering a building facade includes a number of separate curtain wall elements 105 preferably constituted of aluminum, although it will be understood that other suitable materials may be used, such as steel, fiberglass, or other composite materials. In this instance the curtain wall structure is shown as a combination of vision areas and spandrel areas, but it will appreciated that these could be separate components or utilized in varying combinations. The curtain wall units 105 can be configured as desired to extend across multiple stories in a continuous strip of spandrel and vision areas. While the elements 105 are shown as separate components it will be appreciated that larger "units" in the form of multiple curtain wall elements could be assembled off-site in some instances.

The curtain wall elements 105 are further adapted to preferably include a photovoltaic (PV) module 120 and/or other energy conversion device. Such devices could include capability for converting other forms of electromagnetic energy, potential energy, kinetic energy, thermal energy and/or chemical energy including photochemical energy. For example, thermionic, piezoelectric and/or mechanical devices could be integrated for harnessing heat/wind/rain energy). Other examples will be apparent to those skilled in the art, and it is expected that other conversion devices will be adapted for use with the present invention. Because of their physical structure the curtain wall elements 105 can be easily adapted (mechanically/physically) to house/integrate different types of such conversion devices (which tend to be smaller than such elements) using the principles set out herein. It will be understood that the conversion devices can be spatially arranged as part of the curtain wall elements in any convenient fashion appropriate for the particular installation. Furthermore as shown in FIG. 1, it is possible that some elements 105 may include conversion devices, while others may not, again depending on system requirements and goals.

In addition, in some instances well-known solar thermal energy collectors/plates could be embedded instead or in addition within the curtain wall elements for heating a conductible fluid, air or some other medium for transporting heat energy. Other well-known solar thermal support elements such as mirrors, lenses and other concentrators (not shown) could be used of course to increase the heat concentration, and conventional heat storage devices (not shown) can be incorporated to store heat energy.

The PV module used in the preferred embodiment can be any one of a variety of virtually any commercially available PV module, including preferably a crystalline solar cell/module offered by Suntech Power. The PV module can include any number of conveniently and conventionally interconnected individual solar cell devices, such as described in the aforementioned prior art references. As is known in the art, the photovoltaic technology utilized by the PV module may be based on any suitable photovoltaic conversion technology, including for example, thin film, dye tinted, fullerene based, polycrystalline, or monocrystalline. The specifics of the solar cell/module (or other energy conversion device) are not material to the present invention; however regardless of their specific photovoltaic conversion technology the PV modules must be suitable to physically integrate them within the unitized curtain wall units. Accordingly, a wide variety of existing and contemplated technologies can be accommodated, thus making the invention PV module "agnostic," which further enhances the commercial potential for the invention.

Conventional vision material or, in this case, glass panels 115 are also shown in FIG. 1. As described, these glass panels can be configured to have more than one panel along the vertical axis of the unit. In this configuration, the glass panels will be separated by intermediate horizontal framing members. Further, while the PV module 120 is shown in FIG. 1 in the vision area of the building structure 100, it can alternatively be integrated into spandrel areas or as part of a spandrel based module 110, or in any number of combinations of such areas based on system requirements and design aesthetics.

A linked solar array or assembly of PV curtain wall elements 105, 105', 105" etc. is thus shown mated together, cladding or enclosing a structure, preferably extending both horizontally and vertically across multiple floors. The elements 105 are preferably sized to be compatible with conventional building elements to further increase their integration potential. This arrangement is also useful for increasing the overall solar energy potential coverage for up to nearly 100% of the wall area of a structure. In contrast, typical rooftop systems only allow for a limited percentage of an overall surface area.

Figure 2:
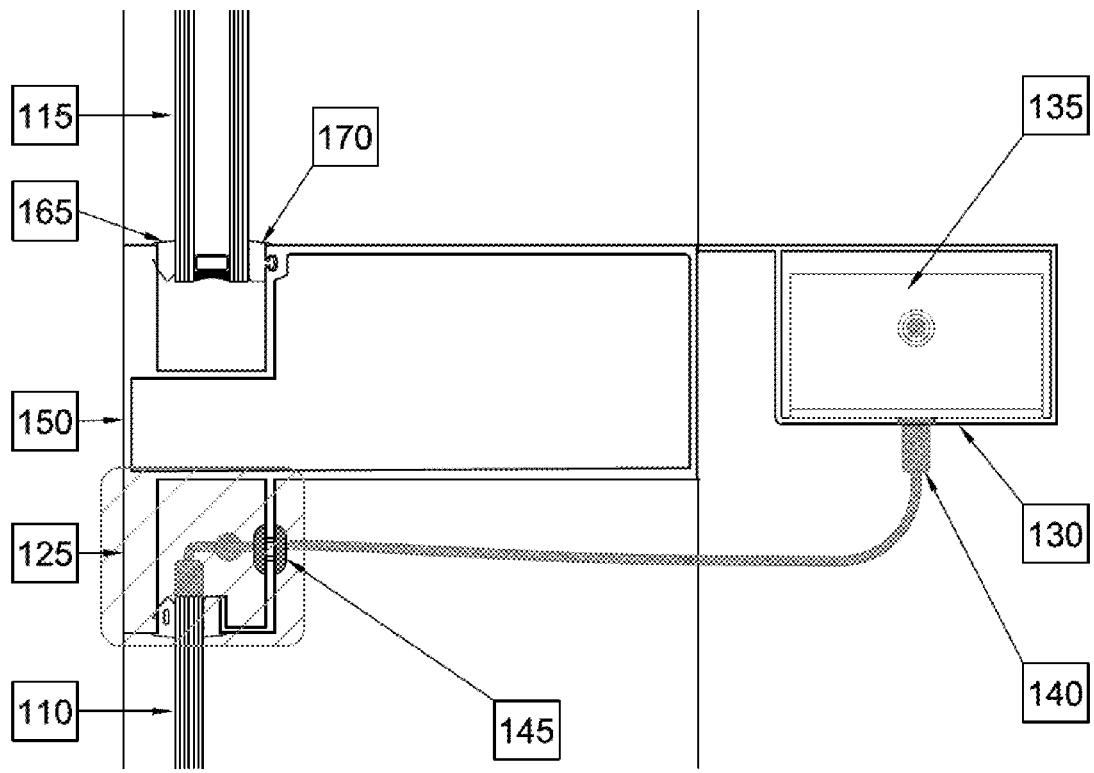
FIG. 2 shows a cutaway section of the building structure along the direction shown in FIG. 1 designated with a bubble and the numeric notation 2, to illustrate further details and the spatial relationship of components of the preferred solar power generating system.

FIG. 2 shows a cutaway section of the building structure 100 along the vertical axis/direction shown in FIG. 1 designated with a bubble and the numeric notation 2. In this figure the structure of the curtain wall units (such as 105, 105' and 105" which are otherwise identical) is further elaborated, including the relationship of the BIPV module 110 to the other components. In general, the typical components of curtain wall framing members on a BIPV curtain wall unit 105" are largely the same in concept as conventional curtain wall framing members. However there are specific and significant differences that allow PV Panels to be used in place of other conventional infill material as explained below.

Specifically, as seen in FIG. 2, the PV module 110 (located in a spandrel area as depicted in FIG. 1) is preferably mounted within an extra deep glazing pocket 125 shown generally with cross hatching for emphasis. The extra deep glazing pocket 125 is preferably part of a topmost horizontal framing member 150 in the spandrel area. This framing member 150 is also distinct from conventional designs in that it preferably allows extra space in the glazing pocket 125 for an edge mounted junction box for the PV module 110 and the PV Leads 140 that come out of the PV module.

The framing members of the preferred embodiment are unique in that they form both vertical and horizontal conduits/channels for inter-module connectivity, including preferably, power lines, control signal lines, and reporting lines. In some applications as noted earlier it may be desirable to transport other fluids, gasses, etc. to and between modules using appropriate channels. Further, in some applications the desired control and reporting information flowing to and from the PV module 110 may be transported using wiring or wireless technology, thus obviating the need for the separate control signal and reporting lines.

The curtain wall units 105 are engineered using conventional techniques so that they are adequately resistant to water, pressure and other physical influences that might be attendant to a particular locale. Those skilled in the art will appreciate that the specific physical implementation can be varied from site to site in accordance with local building code, geological and weather based parameters.

Framing member 150 further preferably includes an opening allowing the PV leads 140 (or other flexible conduit/piping for transporting fluids/gasses) to be routed to a management module or control circuit 135 preferably situated in a power/control raceway 130. Again, to the extent other types of materials are transported, the opening can be varied accordingly.

Power/control raceway 130 is preferably attached to the solar array after installation of the curtain wall units on the building using any of the techniques known in the art. Nonetheless it can be preassembled as well in some instances. The management module 135 is preferably a unit designed for individual and group control of PV modules such as sold by TIGO Energy under the name Energy™ Module Maximizer-EP (MM-EP) and/or modules as described in US Patent Publication Nos. 20080097655 and 20090120485 incorporated by reference herein. There are many other power topologies accommodated, including but not limited to, Enphase, Solar Edge, Solar Magic, or Enecsys. The management module can be used to selectively monitor, troubleshoot, activate or de-activate portions of a building's solar array system, including on a side by side, floor by floor, or individual basis such as might be needed for accommodating window cleaning or maintenance as examples.

The management module is part of a control circuit that preferably optimizes power output of each module that it is connected to, and delivers module-level data for operational management and performance monitoring and/or control. The TIGO unit in particular uses dynamic module balancing which manages the energy harvest and sends information for reporting and control. The modules can be connected in a variety of known methods, depending on system needs.

The benefits of such module specific control/transmission/communication within a building structure is that they allow for greater efficiency in power collection and more effective elimination of prior art losses caused by shading by other external elements (trees, other buildings, dirt, etc.) and inherent mismatches in PV modules. These problems have heretofore greatly limited efficiencies of solar arrays in horizontal, vertical, or inclined configurations, particularly in densely built areas. Furthermore since such management modules 135 are UL rated to UL 1741, they can be used in preferred embodiments of the invention in which an entire solar array for a building is effectively compliant as constructed with UL (and other safety organization, such as Canadian Standards Association (CSA), InterTec North America (ETL), Tuv Rheinlan (TUV)) requirements because it consists of elements which are each previously certified.

The other advantage of the preferred TIGO management module is the improved safety of the solar array during operation. In particular, during an emergency, for example, the high voltage wiring in the preferred embodiment can be shut off, thus preventing accumulation of voltage and limiting voltage exposure to the open-circuit voltage (Voc) of a single module 110, generally no more than a normally non lethal level of approximately 60V. More advantageously this function can be activated with a safety button or via a remote management console or a network such as the Internet (not shown) for maximum flexibility. This function can also be tied into the buildings existing safety system so it can be automatically activated in the case of an emergency. Consequently the system can be installed, maintained or approached by personnel (including fire or other emergency personnel) without exposure to voltage levels which, in some topologies of conventional arrays typically exceed 400 volts during peak operation.

Finally, because each PV module 110 can be controlled individually by the management modules, it is possible to link and interconnect longer runs of PV modules that span more than one face of the building. While the present description presents the TIGO unit as an example it should be understood that the invention is not limited to any particular control module.

While the management modules 135 are shown within the power/control raceway 130, it is expected that future generations of integration modules will continue to shrink in size and therefore can be placed in a variety of locations. For example it will be apparent that they can be located in other areas of the curtain wall element 105", including directly on the PV module 110 or directly within the framing members, the wiring channels, or potentially embedded in PV Modules 110. However, it should be noted that there is a benefit in most cases to locating the management modules within the power/control raceways because in this way, the signal lines are better isolated and easily routed between pairs of adjacent management modules.

The opening for the PV module leads 140 preferably includes a grommet 145 on the inboard vertical surface of the horizontal framing member 150. This allows for the PV module leads (or other conduits, tubes, etc.) 140 to exit the framing member 150 and enter the power/control raceway 130 in a safe and secure fashion, and in a manner that resists aging, corrosion, and damage from movement that may be cause by earthquakes, wind, etc. Skilled artisans will appreciate that the additional space shown within framing member 150 that is not used in the embodiment shown in FIG. 2, could be used in some applications to route electrical wiring or alternative form factors of management module 135. Again also in other embodiments of the invention (using other forms of conversion devices or solar heat collectors) additional tubing, conduits, etc., could be routed within this part of the framing members and used to transport heat energy in the form of a conductible fluid, gas, air, etc. to other areas of the building structure.

Again, one preferred aspect of the present invention is to ensure UL and/or CSA/TUV/ETL compliance. The curtain wall units 105 and power/control raceways 130 of the preferred embodiment further serve such aim by including the capacity to handle regulatory rated cabling, and with mountings (i.e., appropriate hole sizing, grommets and other tethering/tieing mechanism) and cable runs/shielding that allow for appropriate separation of different types of signal cables, such as high and low power lines, that are also designed to satisfy applicable regulations.

Note as shown in FIG. 1 the floor level in the preferred embodiment is somewhat below the bottom of the horizontal framing member 150, but, this can be altered as desired in any particular installation. Power/control raceway 130 is also preferably designed to be UL-compliant, reducing duration of work on site, construction costs certification expense and commission expenditures. To this end the raceway may be comprised of materials well-known in the art.

The rest of the curtain wall unit 105" is shown with conventional vision material elements 115, and various gaskets—for example, wedge gasket 165, and bed gasket 170, to help in securing and isolating the PV module 110 from the curtain wall unit 105'. Note that these same types of gaskets are also shown but not annotated specifically in the deep glazing pocket region 125. The gaskets are preferably comprised of materials that are UL rated for this purpose and may vary from installation to installation.

Figure 3:
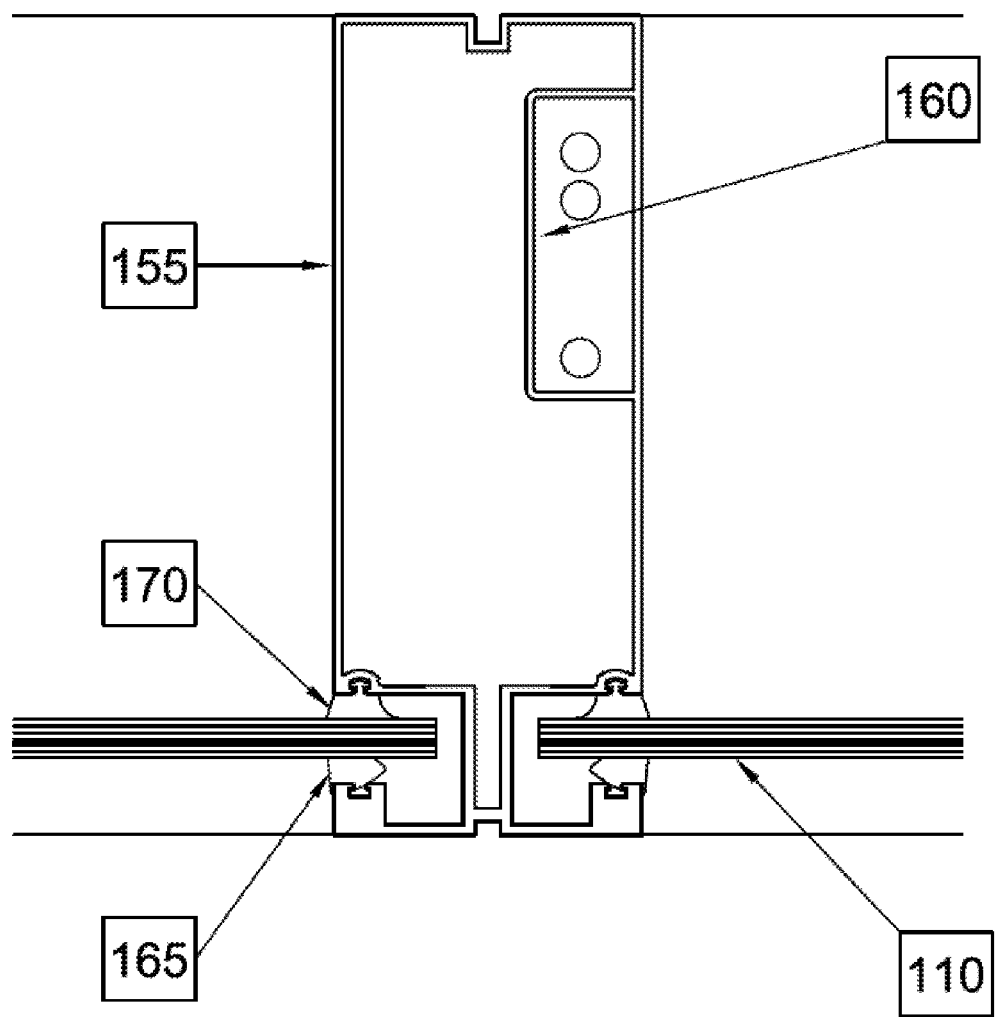
FIG. 3 shows a cutaway section of the building structure along the direction shown in FIG. 1 designated with a bubble and the numeric notation 3, to illustrate further details and the spatial relationship of components of the preferred solar power generating system.

FIG. 3 shows a plan view of a curtain wall along the horizontal axis/direction shown in FIG. 1 with the annotation/label having a circle with the number three (3). This perspective is shown between two adjacent curtain wall units 105' and 105."

In particular it can be seen that the PV modules 110 are preferably insulated and isolated by a set of gaskets 165, 170 as noted before in FIG. 2. As is known in the art, the use of such gaskets accommodates normal material expansions/contractions, and allows for flexibility and movement of the panels, such as needed for wind, seismic and other disturbances. While gaskets are illustrated as the isolating mechanism in the preferred embodiment (including for electrical isolation), it will be noted that other materials could be used, including structural silicones or VHB tape, such as that sold by 3M (Minnesota Mining and Manufacturing) without parting from the scope of the invention.

The main feature of FIG. 3 is a vertical framing member 155, the top of which is shown in this plan view. This framing member, like the horizontal framing member 150 noted earlier, is preferably formed from the spaces created in the mating or coupling of the individual curtain wall units 105, and preferably without requiring additional separate structures or materials. As with its counterpart this member has additional space that can be used to accommodate other types of conduits as needed by particular energy conversion devices.

An additional structure, namely an integral vertical wiring management clip 160 is also included as part of the curtain wall unit 105". This clip effectively behaves as a vertical conduit to accept, manage and integrate the power and signal cables from PV modules 110, allowing them to be interconnected in a vertical orientation as well. Thus, as seen in FIG. 1, the PV modules 120 in a vision area can be coupled directly to PV modules 110 in a spandrel area, or even to other modules in a spandrel area below vision area 120, and so on. The use of both vertical and horizontal wire accepting frame members allows for PV modules to be connected in a checkerboard fashion, both in the vertical and horizontal direction, to form a larger array across the face of the building structure and even across separate faces of the building structure.

Note that the shape and form of the clip 160 is illustrated in the preferred embodiment as a solid rectangular box structure in FIG. 3, but any number of variants could be used to accommodate the power/signal cables. Additional conduits could also be incorporated (including on the opposite curtain wall element 105') as desired for any application. While the conduits are shown in a closed configuration (which permits easy threading/routing of the cables) it will be apparent that other structures could be used. For example the wiring may also be prefabricated or built into the curtain wall unit 105, (for example along the edge of the vertical framing member). Such wiring would preferably connect with an electrical coupler to PV module leads 140. At the other end of the framing member a corresponding electrical coupler could be used to connect to the leads from a second PV module, or, alternatively, to leads extending to a management module 135. Any number of similar variants are possible, and the invention is not limited in this respect.

As with the other elements of the curtain wall unit 105" the vertical wiring management clip 160 is preferably constructed in a UL compliant manner to permit installation of the units without additional regulatory approval or accompanying delays.

FIG. 4 is a plan view again along the horizontal direction shown in FIG. 1 with the bubble label containing the number 4. This figure is a cut-away and illustrates more of the details of the power/control raceway 130 used in preferred embodiments of the present invention(s).

The power/control raceway 130 is another feature unique to the present invention. Though similar in function to existing technology, the power/control raceway 130 is unique in that it may also be used for multiple purposes: as a conduit to carry the management module-management module cabling 165 (or other tubing/conduits), to contain management module 135, and to serve as an interior architectural trim piece. While not shown in FIG. 4, the power/control raceway also preferably includes a grommeted hole and access for a connector on the underside (bottom) as seen in FIG. 2 for receiving the leads 140 from the PV modules. Again the location of the connector is not critical, and the cabling/coupling is expected to be accomplished in any number of different ways.

Returning to FIG. 4 the power/control raceway 130 is preferably formed separately in a predetermined length and then integrated as an assembly on part of the backside of a curtain wall unit 105 after unit installation on the structure. This enables each curtain wall unit 105 to effectively act as a unitized building block for constructing a solar array when integrated with the power/control raceway 130 as part of a building façade without additional supporting elements. In some embodiments the power/control raceway can be implemented in a similar manner in the vertical direction.

The power/control raceway 130, as with the other curtain wall elements, is in the preferred embodiment is to be rated for Underwrites Laboratories (UL) or similar organization compliance and is made of aluminum or some other cost effective materials.

The management modules 135 are located in the power/control raceway 130 and manage/control/communicate with the individual PV modules. These management modules preferably optimize power output per each PV module and exchange operational management and performance monitoring data, allowing remote manipulation/management of the array.

The PV module leads 140 are coupled between the PV modules and the management modules to transmit generated power and communicate other status information to and from the modules. It will be understood that the particular coupling, wiring, etc., is expected to vary between different types PV modules or energy conversion devices.

Figure 6:
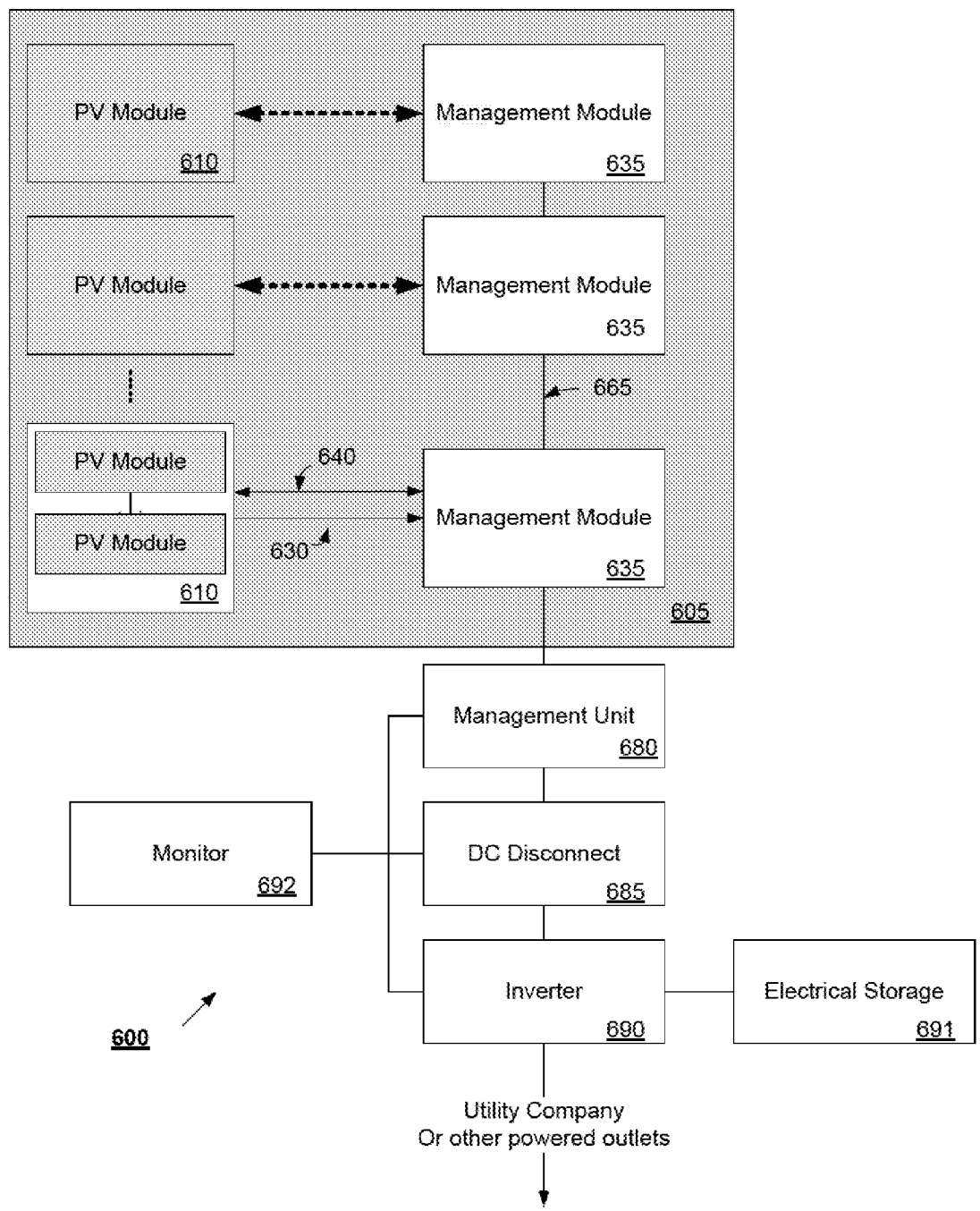
FIG. 6 is a block diagram of the main electrical components employed in the preferred solar power generating system.

Management module to module cabling 165 carries the accumulated power to a management unit 680 (See FIG. 6). The management unit is preferably a TIGO Energy™ Maximizer Management Unit (MMU) that manages the whole assembly by processing the individual and aggregated information from the PV modules. In a preferred embodiment, the management unit is capable of managing an entire set of management modules 635 for a building and/or an array. The management unit communicates between the management modules 635 and an Inverter 690 which is a modified typical component of any solar power generation system. Inverter 690 inverts DC to AC as known in the art. The management unit (680) preferably controls the management modules in real time and sends data to a remote server 695 in order to allow on or offsite monitoring of light, temperature, electricity production and other parameters and provides the resulting information as needed. Again the monitoring system architecture will be a function of the particular energy generation mechanism selected, and it is expected that other variants of the above will be used with different energy conversion systems.

Returning to FIG. 4, this also shows a bonding jumper 175, which is used to connect the individual curtain wall elements to each other, and, eventually, to a ground potential such as the steel frame, or other conventional common grounding element in the building electrical system (not shown). In the preferred embodiment grounding is accomplished by any of the means known in the art.

Figure 4:
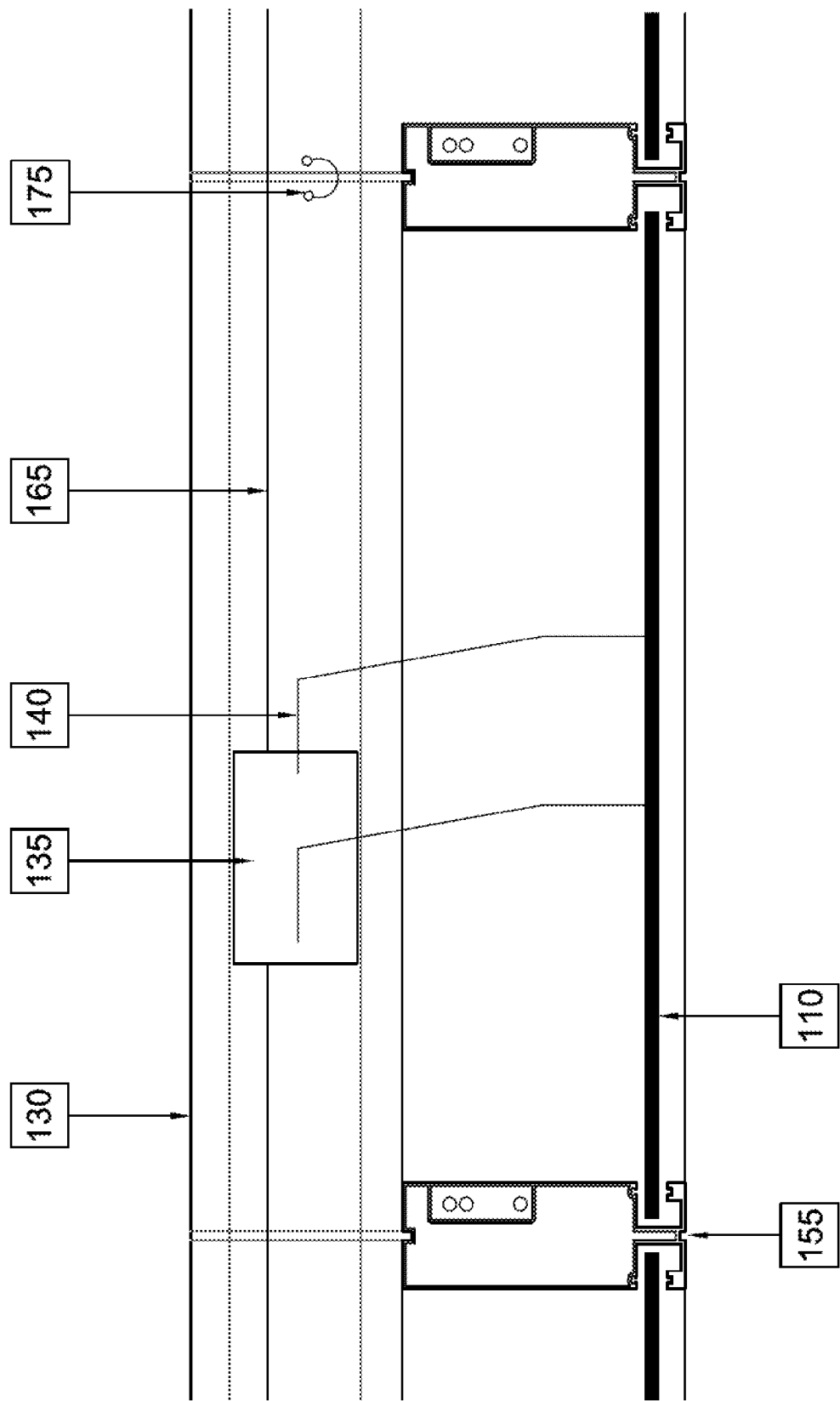
FIG. 4 shows a cutaway section of the building structure along the direction shown in FIG. 1 designated with a bubble and the numeric notation 4, to illustrate further details and the spatial relationship of components of the preferred solar power generating system.
Figure 5:
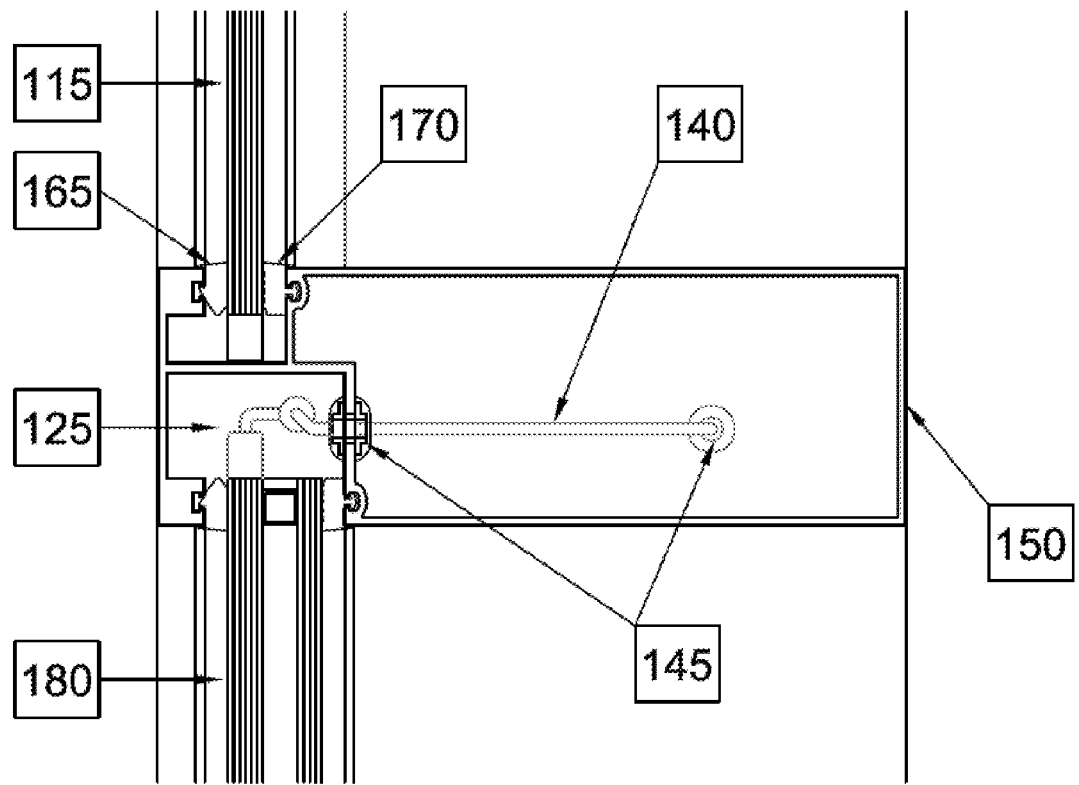
FIG. 5 shows a cutaway section of the building structure along the direction shown in FIG. 1 designated with a bubble and the numeric notation 5, to illustrate further details and the spatial relationship of components of the preferred solar power generating system.

Note that a portion of the vertical framing members 155 can be seen in FIG. 4 as well. The routing of PV module leads 140 into such framing members is also shown in more detail in FIG. 5. FIG. 5 shows a cross section of the building in FIG. 1, along the bubble annotated with the number five (5). As shown in FIG. 5, the PV module leads 140 preferably extend from the top of a PV module 180; they are routed through grommet 145, and then into the horizontal framing member 150; and then they are routed to the vertical framing member 155, and thus can be transported (up or down) through the vertical wiring management clip 160.

Figure 8A:
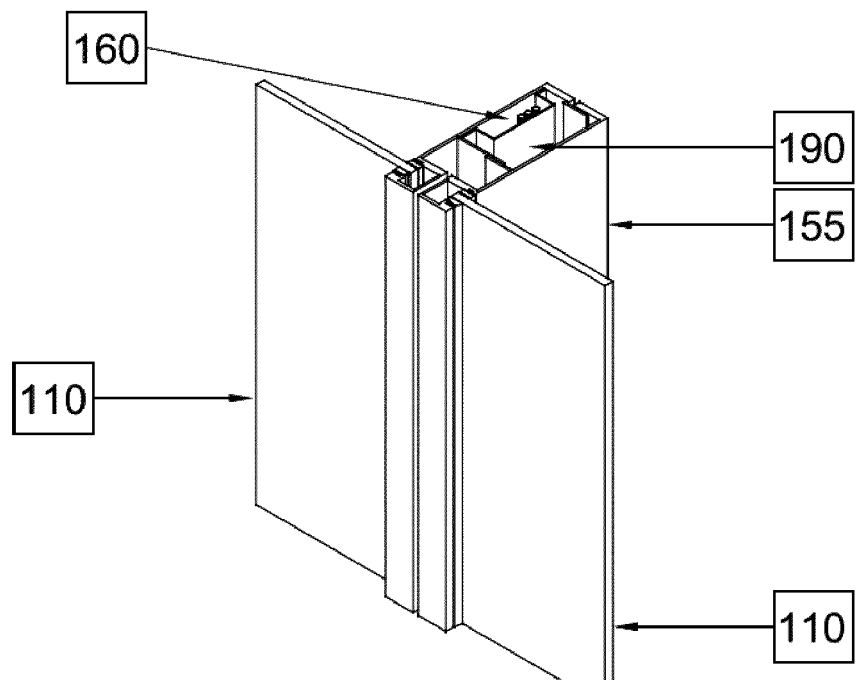
FIGS. 8A and 8B show another perspective of the curtain wall units along the direction shown in FIG. 1 designated with a bubble and the numeric notation 8, to illustrate further details and the spatial relationship of components of the preferred solar power generating system.
Figure 8B:
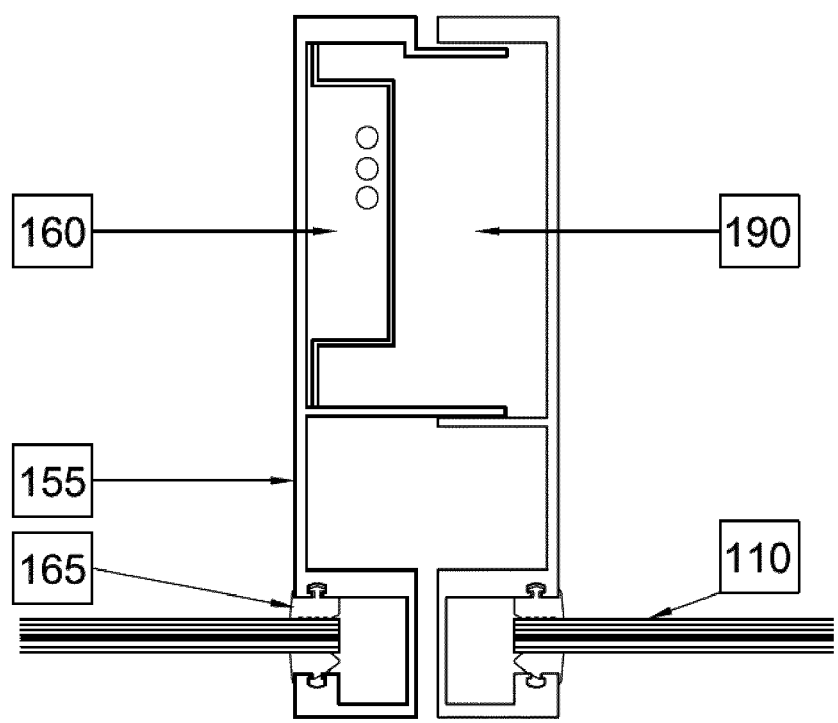

FIGS. 8A and 8B show another perspective view of the mullions formed by a pair of adjacent curtain wall elements 105. The additional space 190 formed within the mullion is usable as noted earlier for other array elements as needed. All other labeled elements are the same as like numbered items discussed in earlier figures.

An electrical diagram showing the main preferred components of a solar power generation system is shown in FIG. 6. In this figure, like numbered elements are intended to correspond to their counterparts in prior figures unless otherwise noted.

As seen in FIG. 6 an array of PV modules 610/620 are preferably coupled to each other through the management module 635. The connections between the PV modules and the management modules are preferably done through the PV leads 640 that are routed both vertically and horizontally through framing members 650 and 655 respectively as noted earlier. The management modules 635 are themselves preferably connected through cabling 665, and eventually to a management unit 680 as noted above. The wiring for these connections, are preferably done with power/control raceways 630 that are integrated with the curtain wall units 605.

In the preferred embodiment, management unit 680 is in turn preferably coupled to a DC disconnect 685. As noted above, DC disconnect may preferably be activated either manually or electronically to isolate power to the output of the individual PV module. The output of this DC disconnect is preferably coupled to an inverter 690 which converts the DC generated voltage into an AC voltage in a well-known manner. Note that the management unit 680 is shown outside of the curtain wall unit 105, but it could be included within that unit without departing from the scope of the present invention.

The preferred embodiment includes a monitoring system 692 can be used to evaluate the performance of the individual PV modules 610 through interrogation of their respective management modules 635. The monitoring system includes conventional computing equipment and software for coordinating data exchanges, calculations, etc., with the management unit and management modules as is known in the art. Preferably the computing system is a server that is Internet accessible for remote access.

The output of the array is preferably connected to the building electrical system, typically in the main distribution area, where it can be used to offset consumption of electrical power or feed power into the utility grid. In some instances the array can offer other DC and AC outlets for charging electrical devices, transportation vehicles, etc. The form of the output, including voltage levels, current levels, etc., can be tailored as needed for any particular application. Furthermore if desired a conventional electrical storage system 691 can be employed in some cases to provide back-up power if desired. Again it will be understood that the support elements for a particular power generation system will vary according to the energy conversion devices used, and FIG. 6 is merely depicting the typical elements that would be used in a solar to electrical conversion system.

Figure 7:
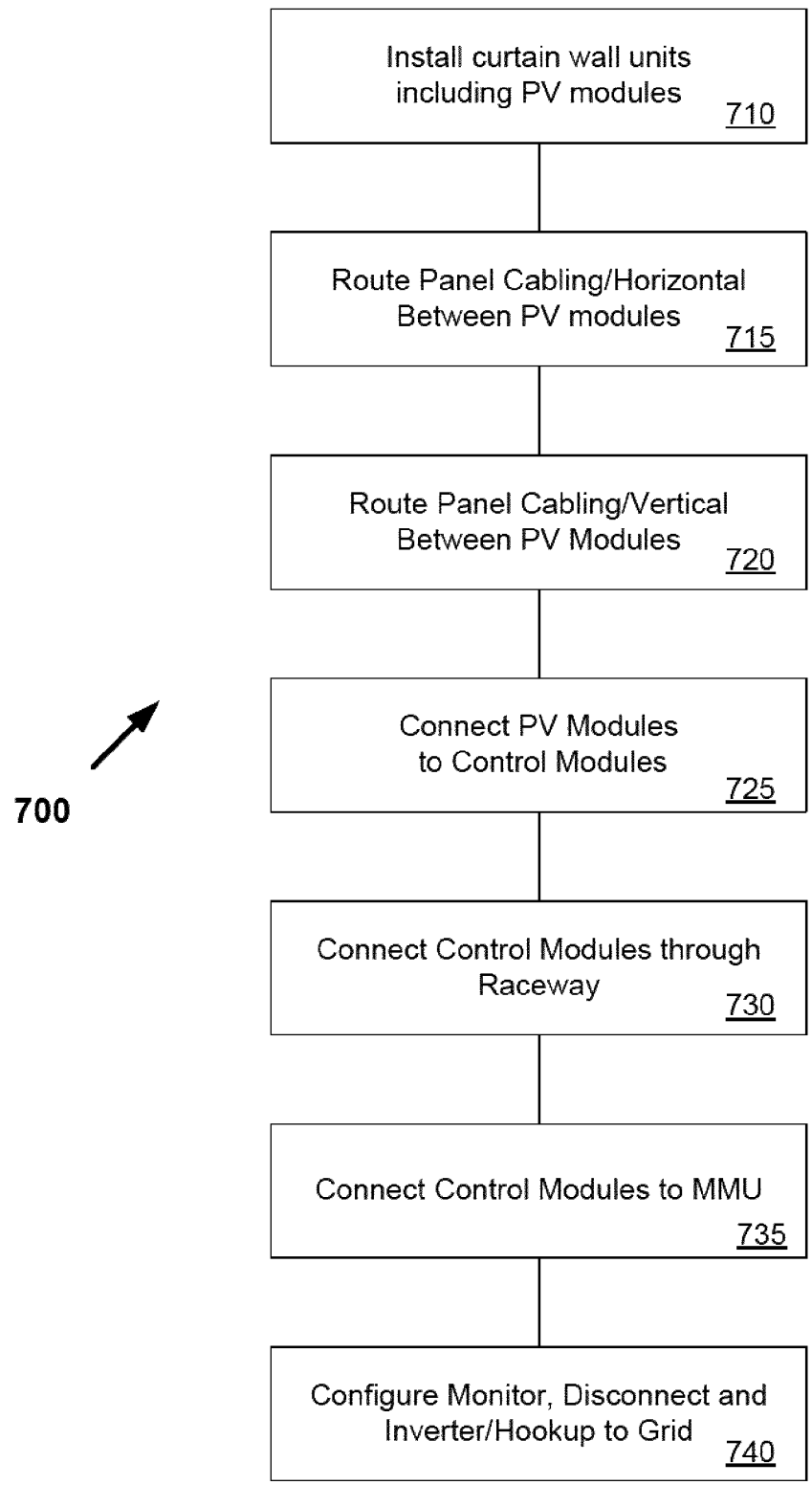
FIG. 7 is a flowchart depicting a preferred process used to assemble embodiments of the solar power generating system.

FIG. 7 is a flowchart illustrating the general steps employed in a preferred PV solar system assembly process. At step 710, the curtain wall elements 105 are preferably hung on a building structure in a manner effectively identical to that used in conventional curtain wall systems with the differences described above.

At steps 715 and 720 the PV module leads are then preferably routed both horizontally and vertically as needed through framing members 150 and 155 respectively integrated within the curtain wall units 105. This allows for flexible interconnection of adjacent PV modules in the solar array.

During step 725 the PV module leads 140 are preferably connected to management modules 135 through connectors contained in horizontal framing member 150. At step 730 the individual management modules are also preferably electrically coupled together using the management-module-to-management module cabling 165 in the power/control raceway 130.

The grounding can be achieved during any one or more of the above steps in the manner known in the art. At this point the entire assembly, consisting of unitized curtain wall elements interconnected to form a solar array, is also completely safe and preferably UL compliant.

At step 735 the integration module 135 outputs are preferably connected to one or more management unit 680 as described earlier. At step 740, the electrical power can then be conveniently transferred to the building electrical distribution system, or made available through other outputs for other applications (charging). It will be apparent the above steps do not have to be performed in the sequence noted, and that the actual assembly process will likely include other obvious variants of the above.

To summarize, it can be seen that the invention implements a new type of PV capable curtain wall unit that has been specifically designed and engineered to be a power generator, but accomplishes a dual purpose: to enclose the building aesthetically as part of the outermost exterior shell enveloping the bulk of the building façade. Summing up, in the preferred embodiment, this is achieved by, among other things:

- extra deep glazing pockets incorporated in curtain wall units
- adapting the framing members to include UL and other compliant conduits, channels and raceways for wiring
- housing control and management mechanisms locally, in each unit
- Including control needed to eliminate the deleterious effect of on-site/orientation shaded unit from others
- electrically isolating the PV modules with the use of code compliant sealants and gaskets
- the addition of ports and isolating grommets to facilitate electrical connections and contain control mechanisms in the framing members
- framing members with flexible parts/sleeves to accommodate movement (for example in response to a seismic events) without damage to the electrical wiring As such, virtually all of the components of conventional curtain wall units are adapted to deliver solar generated power as part of a PV system which is constituted substantially within an exterior aesthetic shell.

UL Compliance/Other Third Party Organizations

Unlike prior art systems, preferred embodiments of the invention thus efficiently achieve UL compliance as built because:

- each unit is grounded;
- wiring and associated control devices are housed in a pre-certified raceway (for example, inner cavities of the framing members); and
- electrical isolation is provided between the PV panels and their framing/surrounding elements (via the sealants and gaskets—that are manufactured from code-rated materials).

Retrofits:

Embodiments of the invention can also be used for an existing building or structure which can be retrofitted or re-clad to incorporate other variants of the invention. Moreover in some instances, the PV modules can be integrated into curtain wall units in an array suitable for mounting on mechanical screening or other vertical faces (not shown) typically found on a building or structure. By utilizing such previously unproductive space, the invention can add value to existing properties by making them more cost-effective, attractive to environmentally conscious tenants, and so on.

As alluded to above the present invention can also be used with additional PV enhancement devices, such as solar concentrators, solar trackers (active and passive) and the like (not shown). Particularly in the spandrel areas, where appearance is not as critical, the integration of solar concentrators/trackers within the curtain wall elements could be used to greatly increase the collection of solar flux, by altering a radiation path to make it more incident to the elements, or adjusting the orientation of the elements themselves.

While not explicitly shown or described herein, the details of the various software routines, executable code, firmware, etc., required to effectuate the functionality discussed above in the management modules, management units and monitoring systems are not material to the present invention, and may be implemented in any number of ways known to those skilled in the art. Such code, routines, etc. may be stored in any number of forms of machine readable media.

The above descriptions are intended as merely illustrative embodiments of the proposed inventions. It is understood that the protection afforded the present invention also comprehends and extends to embodiments different from those above, but which fall within the scope of the present claims.

What is claimed is:

1. An electrical routing structure for a power generating system integrated within unitized curtain wall units mounted within an exterior shell of a building structure and comprising:
    a plurality of energy conversion modules configured in an array and integrated within rigid frames associated with the unitized curtain wall units;
    wherein said unitized curtain wall units are adapted to be hung from and situated in front of the building structure;
    a plurality of contiguous vertical frame members of said rigid frames defining a plurality of vertical mullions within the exterior shell;
    wherein said plurality of vertical mullions are defined solely by adjacent ones of the unitized curtain wall units and without reference to other building structures;
    a plurality of contiguous horizontal frame members of said rigid frames defining a plurality of horizontal mullions within the exterior shell;
    wherein said plurality of horizontal mullions are defined solely by adjacent ones of the unitized curtain wall units and without reference to other building structures;
    said plurality of vertical and horizontal mullions being adapted as an integrated electrical conduit to carry electrical cabling for said plurality of energy conversion modules in a vertical direction and a horizontal direction within the exterior shell so as to transfer a power output of said array;
    wherein said electrical cabling includes both power carrying lines and control signal lines.

2. The electrical routing structure of claim 1 wherein said integrated electrical conduit includes one or more clips to contain said electrical cabling.

3. The electrical routing structure of claim 1 wherein said vertical and horizontal mullions are further adapted to carry tubing and/or piping for transporting other materials to/from said energy conversion modules.

4. The electrical routing structure of claim 1 wherein said unitized curtain wall units span a vertical space that extends and covers a continuous strip of vision areas and contiguous spandrel areas over multiple stories of the building structure.

5. The electrical routing structure of claim 1 wherein said unitized curtain wall units are pre-assembled into a width ranging from approximately 4 feet to 8 feet, and a height ranging from approximately ten feet to 15 feet.

6. The electrical routing structure of claim 1 wherein each of said unitized curtain wall units includes both vision and spandrel regions.

7. The electrical routing structure of claim 1 wherein said integrated electrical conduit meets Underwriter Laboratories (UL) or other applicable local regulatory requirements associated with the building for building integrated power generation systems and does not require a separate onsite inspection prior to operation.

8. The electrical routing structure of claim 1, wherein said energy conversion modules convert at least one of: 1) electromagnetic energy; 2) potential energy; 3) kinetic energy; 4) thermal energy; and/or 5) chemical energy into electrical energy or heat energy.

9. The electrical routing structure of claim 1 wherein said rigid frame is made of aluminum.

10. The electrical routing structure of claim 1 wherein said rigid frame includes a pocket region adapted to mount an edge connector and/or cabling for said energy conversion modules.

11. The electrical routing structure of claim 1 further including control modules integrated within said unitized curtain wall units for optimizing said power output.

12. The electrical routing structure of claim 1 further including an additional wireway/raceway integrated on a back portion of said unitized curtain wall units for routing said electrical cabling.

13. The electrical routing structure of claim 1 wherein said electrical cabling is pre-assembled within said unitized curtain wall units and includes connectors for inter-curtain wall unit connections.

14. The electrical routing structure of claim 1 further including a high voltage disconnect switch that is also integrated into said unitized curtain wall units for selectively disconnecting said power output in response to a predefined event.

15. An electrical routing structure for a photovoltaic generating system integrated within unitized curtain wall units mounted within an exterior shell of a building structure and comprising:
   a plurality of photovoltaic energy conversion modules configured in an array and integrated within rigid frames associated with the unitized curtain wall units;
   wherein said unitized curtain wall units are adapted to be hung from and situated in front of the building structure;
   a plurality of contiguous vertical frame members of said rigid frames defining a plurality of vertical mullions within the exterior shell;
   wherein said plurality of vertical mullions are defined solely by adjacent ones of the unitized curtain wall units and without reference to other building structures;
   a plurality of contiguous horizontal frame members of said rigid frames defining a plurality of horizontal mullions within the exterior shell;
   wherein said plurality of horizontal mullions are defined solely by adjacent ones of the unitized curtain wall units and without reference to other building structures;
   said plurality of vertical and horizontal mullions being adapted with an integrated electrical conduit to carry electrical cabling for said plurality of photovoltaic energy conversion modules in a vertical direction and a horizontal direction within the exterior shell to transfer an output of said array;
   wherein said unitized curtain wall units are adapted to resist water, pressure and other physical disturbances.

16. The electrical routing structure of claim 15 wherein said unitized curtain wall units include mountings and cable runs/shielding that allow for separation of different types of signal cables, including high voltage and low voltage power lines.

17. The electrical routing structure of claim 15 further including an additional wireway/raceway integrated on a back portion of said unitized curtain wall units for routing said electrical cabling.

18. An electrical routing structure for a power generating system integrated within unitized curtain wall units mounted within an exterior shell of a building structure and comprising:
   a plurality of energy conversion modules configured in an array and integrated within rigid frames associated with the unitized curtain wall units;
   wherein said unitized curtain wall units are adapted to be hung from and situated in front of the building structure;
   a plurality of contiguous vertical frame members of said rigid frames defining a plurality of vertical mullions within the exterior shell;
   wherein said plurality of vertical mullions are defined solely by adjacent ones of the unitized curtain wall units and without reference to other building structures;
   a plurality of contiguous horizontal frame members of said rigid frames defining a plurality of horizontal mullions within the exterior shell;
   wherein said plurality of horizontal mullions are defined solely by adjacent ones of the unitized curtain wall units and without reference to other building structures;
   said plurality of vertical and horizontal mullions being adapted as an integrated electrical conduit to carry electrical cabling for said plurality of energy conversion modules in a vertical direction and a horizontal direction within the exterior shell so as to transfer a power output of said array;
   wherein said integrated electrical conduit includes one or more clips to contain said electrical cabling.

19. An electrical routing structure for a power generating system integrated within unitized curtain wall units mounted within an exterior shell of a building structure and comprising:
   a plurality of energy conversion modules configured in an array and integrated within rigid frames associated with the unitized curtain wall units;
   wherein said unitized curtain wall units are adapted to be hung from and situated in front of the building structure;
   a plurality of contiguous vertical frame members of said rigid frames defining a plurality of vertical mullions within the exterior shell;
   wherein said plurality of vertical mullions are defined solely by adjacent ones of the unitized curtain wall units and without reference to other building structures;
   a plurality of contiguous horizontal frame members of said rigid frames defining a plurality of horizontal mullions within the exterior shell;
   wherein said plurality of horizontal mullions are defined solely by adjacent ones of the unitized curtain wall units and without reference to other building structures;
   said plurality of vertical and horizontal mullions being adapted as an integrated electrical conduit to carry electrical cabling for said plurality of energy conversion modules in a vertical direction and a horizontal direction within the exterior shell so as to transfer a power output of said array; and
   wherein said vertical and horizontal mullions are further adapted to carry tubing and/or piping for transporting other materials to/from said energy conversion modules.

20. An electrical routing structure for a power generating system integrated within unitized curtain wall units mounted within an exterior shell of a building structure and comprising:
   a plurality of energy conversion modules configured in an array and integrated within rigid frames associated with the unitized curtain wall units;
   wherein said unitized curtain wall units are adapted to be hung from and situated in front of the building structure;
   a plurality of contiguous vertical frame members of said rigid frames defining a plurality of vertical mullions within the exterior shell;

wherein said plurality of vertical mullions are defined solely by adjacent ones of the unitized curtain wall units and without reference to other building structures;

a plurality of contiguous horizontal frame members of said rigid frames defining a plurality of horizontal mullions within the exterior shell;

wherein said plurality of horizontal mullions are defined solely by adjacent ones of the unitized curtain wall units and without reference to other building structures;

said plurality of vertical and horizontal mullions being adapted as an integrated electrical conduit to carry electrical cabling for said plurality of energy conversion modules in a vertical direction and a horizontal direction within the exterior shell so as to transfer a power output of said array; and wherein said unitized curtain wall units are pre-assembled into a width ranging from approximately 4 feet to 8 feet, and a height ranging from approximately ten feet to 15 feet.

21. An electrical routing structure for a power generating system integrated within unitized curtain wall units mounted within an exterior shell of a building structure and comprising:

a plurality of energy conversion modules configured in an array and integrated within rigid frames associated with the unitized curtain wall units;

wherein said unitized curtain wall units are adapted to be hung from and situated in front of the building structure;

a plurality of contiguous vertical frame members of said rigid frames defining a plurality of vertical mullions within the exterior shell;

wherein said plurality of vertical mullions are defined solely by adjacent ones of the unitized curtain wall units and without reference to other building structures;

a plurality of contiguous horizontal frame members of said rigid frames defining a plurality of horizontal mullions within the exterior shell;

wherein said plurality of horizontal mullions are defined solely by adjacent ones of the unitized curtain wall units and without reference to other building structures;

said plurality of vertical and horizontal mullions being adapted as an integrated electrical conduit to carry electrical cabling for said plurality of energy conversion modules in a vertical direction and a horizontal direction within the exterior shell so as to transfer a power output of said array; and wherein said rigid frames include a pocket region adapted to mount an edge connector and/or cabling for said energy conversion modules.

22. An electrical routing structure for a power generating system integrated within unitized curtain wall units mounted within an exterior shell of a building structure and comprising:

a plurality of energy conversion modules configured in an array and integrated within rigid frames associated with the unitized curtain wall units;

wherein said unitized curtain wall units are adapted to be hung from and situated in front of the building structure;

a plurality of contiguous vertical frame members of said rigid frames defining a plurality of vertical mullions within the exterior shell;

wherein said plurality of vertical mullions are defined solely by adjacent ones of the unitized curtain wall units and without reference to other building structures;

a plurality of contiguous horizontal frame members of said rigid frames defining a plurality of horizontal mullions within the exterior shell;

wherein said plurality of horizontal mullions are defined solely by adjacent ones of the unitized curtain wall units and without reference to other building structures;

said plurality of vertical and horizontal mullions being adapted as an integrated electrical conduit to carry electrical cabling for said plurality of energy conversion modules in a vertical direction and a horizontal direction within the exterior shell so as to transfer a power output of said array;

wherein said integrated electrical conduit includes one or more clips to contain said electrical cabling.

23. An electrical routing structure for a power generating system integrated within unitized curtain wall units mounted within an exterior shell of a building structure and comprising:

a plurality of energy conversion modules configured in an array and integrated within rigid frames associated with the unitized curtain wall units;

wherein said unitized curtain wall units are adapted to be hung from and situated in front of the building structure;

a plurality of contiguous vertical frame members of said rigid frames defining a plurality of vertical mullions within the exterior shell;

wherein said plurality of vertical mullions are defined solely by adjacent ones of the unitized curtain wall units and without reference to other building structures;

a plurality of contiguous horizontal frame members of said rigid frames defining a plurality of horizontal mullions within the exterior shell;

wherein said plurality of horizontal mullions are defined solely by adjacent ones of the unitized curtain wall units and without reference to other building structures;

said plurality of vertical and horizontal mullions being adapted as an integrated electrical conduit to carry electrical cabling for said plurality of energy conversion modules in a vertical direction and a horizontal direction within the exterior shell so as to transfer a power output of said array;

wherein said energy conversion modules convert at least one of: 1) electromagnetic energy; 2) potential energy; 3) kinetic energy; 4) thermal energy; and/or 5) chemical energy into electrical energy or heat energy.

24. An electrical routing structure for a power generating system integrated within unitized curtain wall units mounted within an exterior shell of a building structure and comprising:

a plurality of energy conversion modules configured in an array and integrated within rigid frames associated with the unitized curtain wall units;

wherein said rigid frame is made of aluminum;

further wherein said unitized curtain wall units are adapted to be hung from and situated in front of the building structure;

a plurality of contiguous vertical frame members of said rigid frames defining a plurality of vertical mullions within the exterior shell;

wherein said plurality of vertical mullions are defined solely by adjacent ones of the unitized curtain wall units and without reference to other building structures;

a plurality of contiguous horizontal frame members of said rigid frames defining a plurality of horizontal mullions within the exterior shell;

wherein said plurality of horizontal mullions are defined solely by adjacent ones of the unitized curtain wall units and without reference to other building structures;

said plurality of vertical and horizontal mullions being adapted as an integrated electrical conduit to carry electrical cabling for said plurality of energy conversion modules in a vertical direction and a horizontal direction within the exterior shell so as to transfer a power output of said array.

25. An electrical routing structure for a power generating system integrated within unitized curtain wall units mounted within an exterior shell of a building structure and comprising:
- a plurality of energy conversion modules configured in an array and integrated within rigid frames associated with the unitized curtain wall units;
- wherein said unitized curtain wall units are adapted to be hung from and situated in front of the building structure;
- a plurality of contiguous vertical frame members of said rigid frames defining a plurality of vertical mullions within the exterior shell;
- wherein said plurality of vertical mullions are defined solely by adjacent ones of the unitized curtain wall units and without reference to other building structures;
- a plurality of contiguous horizontal frame members of said rigid frames defining a plurality of horizontal mullions within the exterior shell;
- wherein said plurality of horizontal mullions are defined solely by adjacent ones of the unitized curtain wall units and without reference to other building structures;
- said plurality of vertical and horizontal mullions being adapted as an integrated electrical conduit to carry electrical cabling for said plurality of energy conversion modules in a vertical direction and a horizontal direction within the exterior shell so as to transfer a power output of said array;
- wherein said electrical cabling is pre-assembled within said unitized curtain wall units and includes connectors for inter-curtain wall unit connections.

26. An electrical routing structure for a power generating system integrated within unitized curtain wall units mounted within an exterior shell of a building structure and comprising:
- a plurality of energy conversion modules configured in an array and integrated within rigid frames associated with the unitized curtain wall units;
- wherein said unitized curtain wall units are adapted to be hung from and situated in front of the building structure;
- a plurality of contiguous vertical frame members of said rigid frames defining a plurality of vertical mullions within the exterior shell;
- wherein said plurality of vertical mullions are defined solely by adjacent ones of the unitized curtain wall units and without reference to other building structures;
- a plurality of contiguous horizontal frame members of said rigid frames defining a plurality of horizontal mullions within the exterior shell;
- wherein said plurality of horizontal mullions are defined solely by adjacent ones of the unitized curtain wall units and without reference to other building structures;
- said plurality of vertical and horizontal mullions being adapted as an integrated electrical conduit to carry electrical cabling for said plurality of energy conversion modules in a vertical direction and a horizontal direction within the exterior shell so as to transfer a power output of said array; and
  - a high voltage disconnect switch integrated into said unitized curtain wall units for selectively disconnecting said power output in response to a predefined event.

27. An electrical routing structure for a photovoltaic generating system integrated within unitized curtain wall units mounted within an exterior shell of a building structure and comprising:
- a plurality of photovoltaic energy conversion modules configured in an array and integrated within rigid frames associated with the unitized curtain wall units;
- wherein said unitized curtain wall units are adapted to be hung from and situated in front of the building structure;
- a plurality of contiguous vertical frame members of said rigid frames defining a plurality of vertical mullions within the exterior shell;
- wherein said plurality of vertical mullions are defined solely by adjacent ones of the unitized curtain wall units and without reference to other building structures;
- a plurality of contiguous horizontal frame members of said rigid frames defining a plurality of horizontal mullions within the exterior shell;
- wherein said plurality of horizontal mullions are defined solely by adjacent ones of the unitized curtain wall units and without reference to other building structures;
- said plurality of vertical and horizontal mullions being adapted with an integrated electrical conduit to carry electrical cabling for said plurality of photovoltaic energy conversion modules in a vertical direction and a horizontal direction within the exterior shell to transfer an output of said array;
- wherein said unitized curtain wall units include mountings and cable runs/shielding that allow for separation of different types of signal cables, including high voltage and low voltage power lines.

28. An electrical routing structure for a photovoltaic generating system integrated within unitized curtain wall units mounted within an exterior shell of a building structure and comprising:
- a plurality of photovoltaic energy conversion modules configured in an array and integrated within rigid frames associated with the unitized curtain wall units;
- wherein said unitized curtain wall units are adapted to be hung from and situated in front of the building structure;
- a plurality of contiguous vertical frame members of said rigid frames defining a plurality of vertical mullions within the exterior shell;
- wherein said plurality of vertical mullions are defined solely by adjacent ones of the unitized curtain wall units and without reference to other building structures;
- a plurality of contiguous horizontal frame members of said rigid frames defining a plurality of horizontal mullions within the exterior shell;
- wherein said plurality of horizontal mullions are defined solely by adjacent ones of the unitized curtain wall units and without reference to other building structures;
- said plurality of vertical and horizontal mullions being adapted with an integrated electrical conduit to carry electrical cabling for said plurality of photovoltaic energy conversion modules in a vertical direction and a horizontal direction within the exterior shell to transfer an output of said array;
- an additional wireway/raceway integrated on a back portion of said unitized curtain wall units for routing said electrical cabling.

* * * * *